(12) United States Patent
Cheng

(10) Patent No.: US 7,701,031 B2
(45) Date of Patent: Apr. 20, 2010

(54) INTEGRATED CIRCUIT STRUCTURE AND MANUFACTURING METHOD THEREOF

(75) Inventor: Chaohua Cheng, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 40 days.

(21) Appl. No.: 11/399,844

(22) Filed: Apr. 7, 2006

(65) Prior Publication Data

US 2007/0252228 A1    Nov. 1, 2007

(51) Int. Cl.
*H01L 29/47* (2006.01)

(52) U.S. Cl. ............ 257/476; 257/485; 257/E29.148

(58) Field of Classification Search ............ 257/471, 257/476, 485, 486, E21.359, E27.04, E29.013, 257/E29.271
See application file for complete search history.

(56) References Cited

U.S. PATENT DOCUMENTS

| | | | | |
|---|---|---|---|---|
| 3,900,344 A | | 8/1975 | Magdo | 148/1.5 |
| 3,906,540 A | | 9/1975 | Hollins | 357/15 |
| 4,224,115 A | * | 9/1980 | Nara et al. | 205/123 |
| 4,752,813 A | | 6/1988 | Bhatia et al. | 357/15 |
| 5,583,348 A | * | 12/1996 | Sundaram | 257/73 |
| 5,665,993 A | * | 9/1997 | Keller et al. | 257/377 |
| 6,218,688 B1 | * | 4/2001 | Kalnitsky et al. | 257/280 |
| 6,492,192 B1 | | 12/2002 | O'Toole et al. | 438/57 |
| 6,720,262 B2 | * | 4/2004 | Koh et al. | 438/687 |
| 6,787,910 B2 | * | 9/2004 | Lee et al. | 257/758 |
| 6,855,970 B2 | * | 2/2005 | Hatakeyama et al. | 257/264 |
| 2002/0127787 A1 | * | 9/2002 | Huang et al. | 438/172 |
| 2003/0087482 A1 | | 5/2003 | Hwang et al. | 438/167 |
| 2005/0062124 A1 | * | 3/2005 | Chiola | 257/476 |
| 2005/0161758 A1 | * | 7/2005 | Chiola | 257/471 |

FOREIGN PATENT DOCUMENTS

TW    1242876    11/2005

OTHER PUBLICATIONS

Chinese Examination Report of Taiwan Application No. 095112820, dated on Jul. 27, 2009.

* cited by examiner

*Primary Examiner*—Minh-Loan T Tran
*Assistant Examiner*—W. Wendy Kuo
(74) *Attorney, Agent, or Firm*—J.C. Patents

(57) ABSTRACT

An integrated circuit structure is described, and includes a substrate, a contact window, and a Schottky contact metal layer. A heavily doped region and a lightly doped region are formed in the substrate. The contact window is disposed above the heavily doped region, and the Schottky contact metal layer is disposed above the lightly doped region. The Schottky contact metal layer and the substrate form a Schottky diode. The material of the contact window is different from that of the Schottky contact metal layer.

11 Claims, 4 Drawing Sheets

INTEGRATED CIRCUIT STRUCTURE AND MANUFACTURING METHOD THEREOF

BACKGROUND OF THE INVENTION

1. Field of Invention

The present invention relates to an integrated circuit structure and manufacturing methods thereof. More particularly, the present invention relates to an integrated circuit structure comprising a Schottky diode and manufacturing methods thereof.

2. Description of Related Art

The Schottky diode is a rectifying device and is composed of a lightly doped semiconductor layer and a metal layer thereon. As a power rectifying device, the Schottky diode has been widely applied to various high speed electric power switches such as power supply switches, motor control drives, telecommunication switches, and switches for factory automation and electronic automation.

However, with the gradually reduced line width of the device, tungsten metal of superior trench filling ability is used to form the contact window during the back process of an integrated circuit. The fabrication of the Schottky diode cannot be integrated with the process of the tungsten contact window and the Schottky diode is usually formed on another chip. Therefore, extra layout designs or assembly are required to integrate the Schottky diode with the integrated circuit having interconnection lines. In this case, the cost of designs and assembly is increased, and the integrity of the device is adversely influenced.

Furthermore, since the Schottky diode achieves rectification by utilizing the work function difference between the lightly doped semiconductor layer and the metal layer thereon, the metal layer must be formed of a low-resistance metal. Otherwise, the efficiency of the Schottky diode will be degraded, and the entire electrical property of the product will be adversely influenced.

SUMMARY OF THE INVENTION

Accordingly, an object of the present invention is to provide an integrated circuit structure and manufacturing methods thereof, in order to form a Schottky diode and an active device on the same chip.

Another object of the invention is to provide an integrated circuit structure and manufacturing methods thereof, which can reduce the cost of design and assembly, increase the integrity of the device and improve the electrical property of the product.

The invention provides an integrated circuit structure comprising a substrate, a contact window, and a Schottky contact metal layer. A heavily doped region and a lightly doped region are formed in the substrate. The contact window is disposed above the heavily doped region, and the Schottky contact metal layer is disposed above the lightly doped region. The Schottky contact metal layer and the substrate form a Schottky diode. The material of the contact window is different from that of the Schottky contact metal layer.

According to the integrated circuit structure described in one embodiment of the invention, said integrated circuit structure further comprises a wire disposed above and electrically connected to the contact window. The wire and the Schottky contact metal layer are simultaneously formed of the same material.

According to the integrated circuit structure described in one embodiment of the invention, the material of said Schottky contact metal layer includes aluminum, copper, molybdenum, gold, platinum, or alloys thereof.

According to the integrated circuit structure described in one embodiment of the invention, the material of said contact window includes tungsten, copper, molybdenum, gold, platinum, or alloys thereof.

According to the integrated circuit structure described in one embodiment of the invention, a spacer is disposed on the side wall of said Schottky contact metal. The spacer and the contact window are simultaneously formed of the same material.

According to the integrated circuit structure described in one embodiment of the invention, a barrier layer is disposed between the Schottky contact metal and the substrate.

According to the integrated circuit structure described in one embodiment of the invention, the material of said barrier layer includes titanium, titanium nitride, tantalum, or tantalum nitride.

The invention provides a manufacturing method of the integrated circuit structure, for example, comprising the steps of: providing a substrate with a heavily doped region and a lightly doped region formed therein; forming a dielectric layer on the substrate, wherein a contact hole exposing the heavily doped region and an opening exposing the lightly doped region are formed simultaneously in the dielectric layer; forming a barrier layer and a first metal layer on the dielectric layer in sequence; removing a part of the first metal layer on the dielectric layer above the heavily doped region and a part of the first metal layer in the opening; and forming a second metal layer over the substrate, patterning the second metal layer, and separating the second metal layer above the heavily doped region from that above the lightly doped region.

According to the manufacturing method of the integrated circuit structure described in one embodiment of the invention, the material of said second metal layer is different from that of said first metal layer.

According to the manufacturing method of the integrated circuit structure described in one embodiment of the invention, the material of said second metal layer includes aluminum, copper, molybdenum, gold, platinum, or alloys thereof.

According to the manufacturing method of the integrated circuit structure described in one embodiment of the invention, the material of said first metal layer includes tungsten, copper, molybdenum, gold, platinum, or alloys thereof.

According to the manufacturing method of the integrated circuit structure described in one embodiment of the invention, the method further includes removing a part of the barrier layer on the surface of the opening after removing a part of the first metal layer and before forming the second metal layer.

According to the manufacturing method of the integrated circuit structure described in one embodiment of the invention, the material of said barrier layer includes titanium, titanium nitride, tantalum, or tantalum nitride.

According to the manufacturing method of the integrated circuit structure described in one embodiment of the invention, the method further includes forming a buffer layer after removing a part of the first metal layer and before forming the second metal layer.

The invention provides another manufacturing method of the integrated circuit structure, for example, comprising the steps of: providing a substrate with a heavily doped region and a lightly doped region formed therein; forming a dielectric layer on the substrate; forming a contact window in the dielectric layer and above the heavily doped region; forming an opening in the dielectric layer for exposing a part of the lightly doped region; forming a metal layer over the substrate; and patterning the metal layer to separate the metal layer above the heavily doped region from that above the lightly doped region.

According to the manufacturing method of the integrated circuit structure described in one embodiment of the invention, the material of said metal layer is different from that of said contact window.

According to the manufacturing method of the integrated circuit structure described in one embodiment of the invention, the material of said contact window includes tungsten, copper, molybdenum, gold, platinum, or alloys thereof.

According to the manufacturing method of the integrated circuit structure described in one embodiment of the invention, the material of said metal layer includes aluminum, copper, molybdenum, gold, platinum, or alloys thereof.

According to the manufacturing method of the integrated circuit structure described in one embodiment of the invention, the method further includes forming a barrier layer after forming the opening and before forming the metal layer.

According to the manufacturing method of the integrated circuit structure described in one embodiment of the invention, the material of said barrier layer includes titanium, titanium nitride, tantalum, or tantalum nitride.

According to the integrated circuit structure and the manufacturing method thereof provided by the invention, the Schottky diode may be integrated with the contact window on the same chip. Furthermore, the contact window is formed of a metal of superior trench filling ability and the Schottky contact metal of the Schottky diode is formed of a low resistance metal, which improves the electrical property of the device and affords an integrated circuit structure of better quality.

In order to make the aforementioned and other objects, features, and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
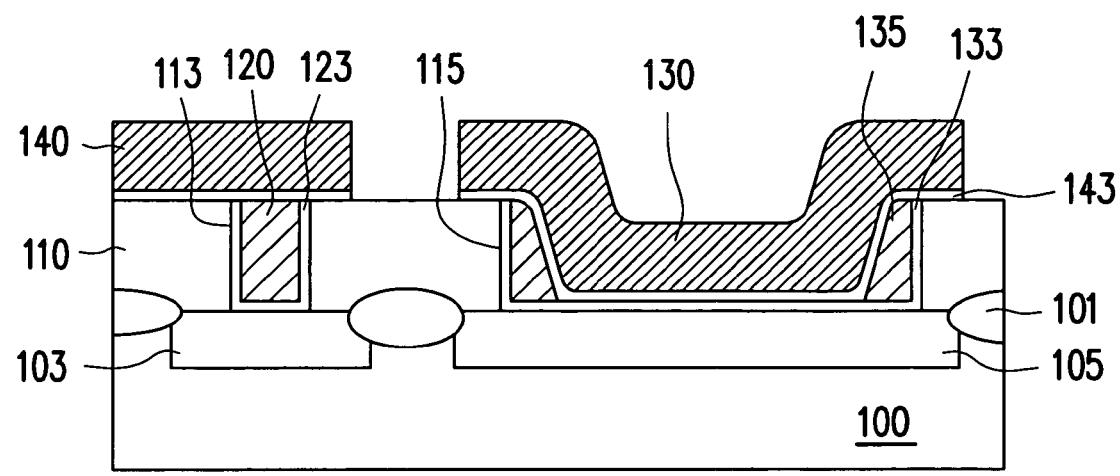
FIG. 1 is a cross-sectional schematic view of the integrated circuit structure according to an embodiment of the invention.

FIG. 1 is a cross-sectional schematic view of the integrated circuit structure according to an embodiment of the invention. With reference to FIG. 1, the integrated circuit structure comprises a substrate 100, a heavily doped region 103, a lightly doped region 105, a contact window 120 and a Schottky contact metal layer 130. The heavily doped region 103 and the lightly doped region 105 are disposed in the substrate 100 and separated from each other by, for example, an isolation structure 101. For example, the heavily doped region 103 is a doped region doped with P-type dopant or N-type dopant. The heavily doped region 103 can be a source/drain of a common logic element (such as MOS element or a memory device). Moreover, the heavily doped region 103 may be disposed in a well region (not shown). The conductive type of the lightly doped region 105 varies according to, for example, the conductive type of the substrate 100. In particular, the lightly doped region 105 is an N-type lightly doped region if the substrate 100 is a P-type substrate, and the lightly doped region 105 is a P-type lightly doped region if the substrate 100 is an N-type substrate. The isolation structure 101 may be a field oxide layer or a shallow trench isolation structure.

A dielectric layer 110 can be disposed on the substrate 100 and can be made of, for example, silicon oxide. A contact hole 113 and an opening 115 are, for example, formed in the dielectric layer, wherein the contact hole 113 is disposed above the heavily doped region 103, while the opening 115 is disposed above the lightly doped region 105, exposing a part of the lightly doped region 105. The contact hole 113 can expose, for example, the heavily doped region 103, or the gate (not shown) of the heavily doped region 103.

The contact window 120 is disposed in the contact hole 113 and made of, for example, tungsten, copper, molybdenum, gold, platinum, or alloys thereof. A barrier layer 123, for example, is disposed between the contact window 120, the dielectric layer 110 and the heavily doped region 103, and the material of the barrier layer 123 can be, for example, titanium, titanium nitride, tantalum, tantalum nitride, tungsten nitride, titanium tungsten nitride, nickel, zinc, zinc nitride, chromium, chromium nitride, or the like. The barrier layer 123 can improve the adhesion between the contact window 120, the dielectric layer 110 and the heavily doped region 103.

The Schottky contact metal layer 130 is disposed above the opening 115 of the lightly doped region 105. The Schottky contact metal layer 130 and the underlying the substrate 100 form a Schottky diode. The material of the Schottky contact metal layer 130 is different from that of the contact window 120 and can be, for example, aluminum, copper, molybdenum, gold, platinum, or an alloy thereof. In one embodiment, the material of the contact window is, for example, tungsten and the material of the Schottky contact metal layer 130 is, for example, aluminum.

A barrier layer 133, for example, is disposed between the Schottky contact metal layer 130, the dielectric layer 110 and the lightly doped region 105, i.e., along the inside wall of the opening 115. The material of the barrier layer 133 can be, for example, titanium, titanium nitride, tantalum, tantalum nitride, tungsten nitride, titanium tungsten nitride, nickel, zinc, zinc nitride, chromium, chromium nitride, or the like. The barrier layers 133 and 123 are, for example, formed simultaneously and are made of the same material.

Furthermore, a spacer 135 is disposed between the Schottky contact metal layer 130 and the dielectric layer 110. The material of the spacer 135 can be, for example, tungsten, copper, molybdenum, gold, platinum, or an alloy thereof. The spacer 135 and the contact window 120 are, for example, formed simultaneously of the same material.

A wire 140 is disposed on and electrically connected to the contact window 120, for example. The material of the wire 140 can be, for example, aluminum, copper, molybdenum, gold, platinum or alloys thereof. The wire 140 and the Schottky contact metal layer 130 are, for example, formed simultaneously of the same material.

A buffer layer 143 is disposed between the wire 140 and the dielectric layer 110, and between the Schottky contact metal layer 130, the dielectric layer 110 and the spacer 135, in order to avoid cross contamination between the contact window 120 and the wire 140 and between the Schottky contact metal layer 130, the dielectric layer 110 and the spacer 135. The material of the buffer layer 143 is, for example, titanium, titanium nitride, tantalum, tantalum nitride, tungsten nitride, titanium tungsten nitride, nickel, zinc, zinc nitride, chromium, chromium nitride, or the like.

Since the Schottky diode and the contact window (and the underlying logic element) of said integrated circuit structure are disposed on the same chip, the integrity of the device is greatly improved. Moreover, because the contact window is formed of a metal with superior trench filling ability and the Schottky contact metal layer is formed of a low-resistance metal, the integrated circuit structure of the invention affords better electrical properties.

Figure 2A:
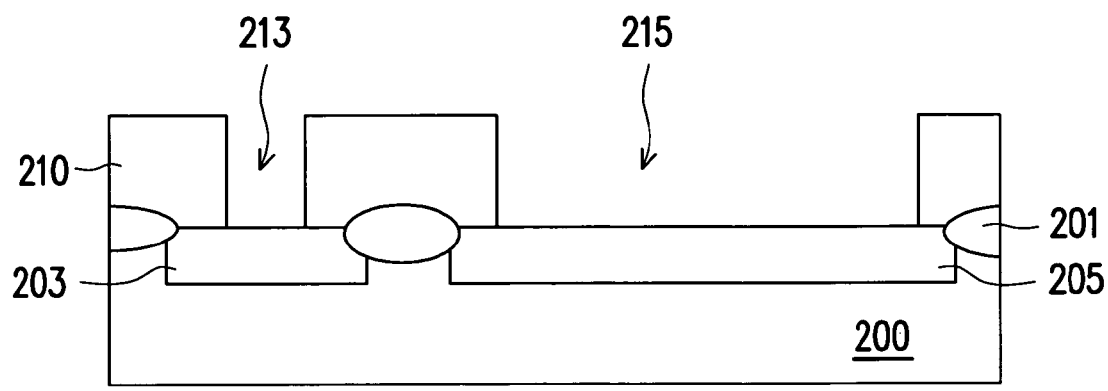
FIGS. 2A-2C are cross-sectional views of the manufacturing process of the integrated circuit structure according to an embodiment of the invention.
Figure 2B:
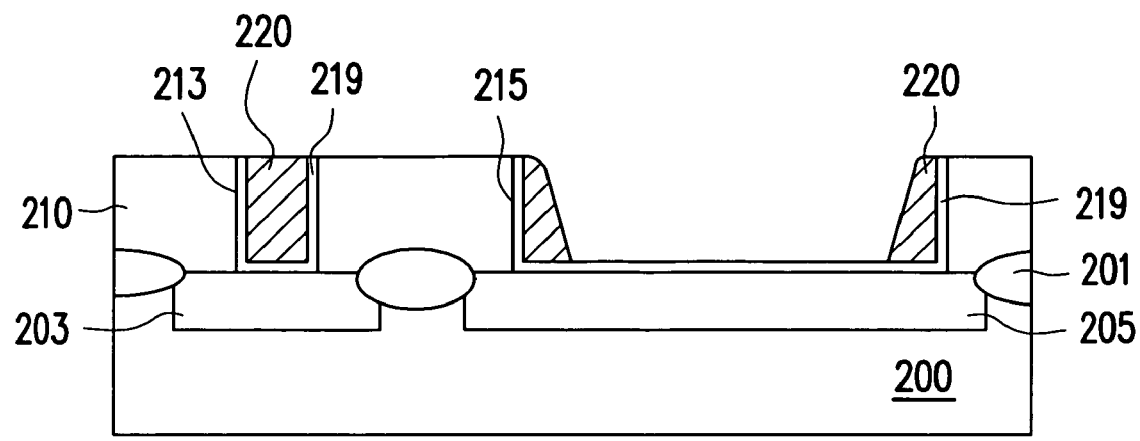
Figure 2C:
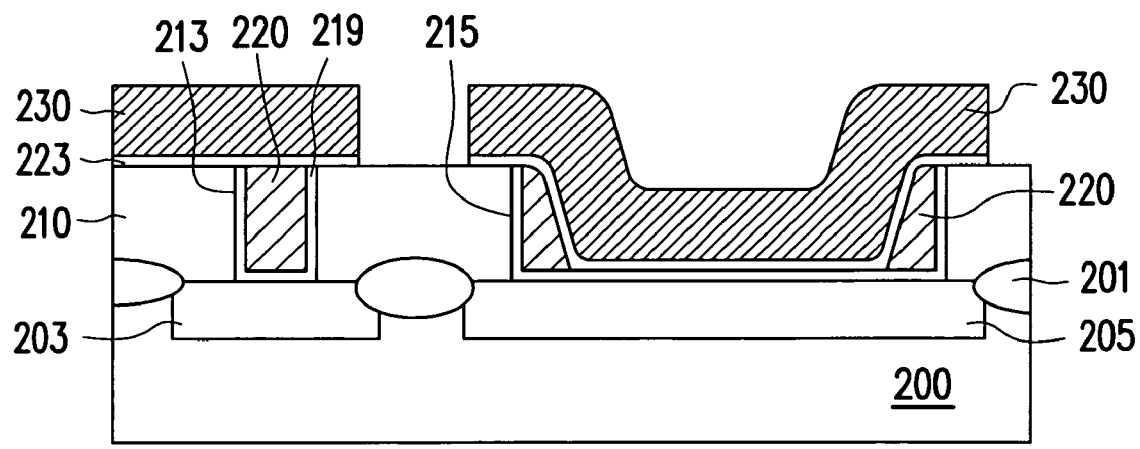

The manufacturing method of the integrated circuit structure according to the invention will be illustrated below. FIGS. 2A-2C are cross-sectional views of the manufacturing process of the integrated circuit structure according to an embodiment of the invention.

With reference to FIG. 2A, according to the manufacturing method of the integrated circuit structure, for example, a substrate 200 with a heavily doped region 203 and a lightly doped region 205 formed therein is provided, wherein these two doped regions are separated from each other by, for example, an isolation structure 201. The heavily doped region 203 is a doped region doped with, for example, P-type dopant or N-type dopant and may be disposed in a well region (not shown). The heavily doped region 203 is, for example, a source/drain of a common logic element (such as MOS element or a memory device), and other elements (such as gate dielectric layer, the gate, and so on) are disposed, for example, on the heavily doped region 203. The conductive type of the lightly doped region 205 can be adjusted depending on, for example, the conductive type of the substrate 200. In particular, the lightly doped region 205 is an N-type lightly doped region if the substrate 200 is a P-type substrate, and the lightly doped region 205 is a P-type lightly doped region if the substrate 200 is an N-type substrate.

Then, still with reference to FIG. 2A, a conformal dielectric layer 210 is formed on the substrate 200 for covering the heavily doped region 203 and the lightly doped region 205, wherein the material of the dielectric layer 210 can be, for example, silicon oxide formed by chemical vapor deposition. The dielectric layer 210 is then patterned to form a contact hole 213 above the heavily doped region 203 and an opening 215 above the lightly doped region 205. The method of patterning the dielectric layer 210, for example, comprises the steps of: forming a patterned photoresist layer (not shown) on the dielectric layer 210; exposing a part of the dielectric layer 210 above both the heavily doped region 203 and the lightly doped region 205; and removing the exposed dielectric layer 210 using the patterned photoresist layer as a mask, to form the contact hole 213 and the opening 215 by, for example, dry etching or wet etching.

Then, with reference to FIG. 2B, a barrier layer 219 is formed on the dielectric layer 210 and filled into the contact hole 213 and the opening 215. The material of the barrier layer 219 can be, for example, titanium, titanium nitride, tantalum, tantalum nitride, tungsten nitride, titanium tungsten nitride, nickel, zinc, zinc nitride, chromium, chromium nitride, or the like, and it can be formed by means of, for example, chemical vapor deposition.

Subsequently, a first metal layer 220 is formed on the barrier layer 219 and filled into the contact hole 213. The material of the first metal layer 220 can be, for example, tungsten, copper, molybdenum, gold, platinum, or an alloy thereof and can be formed by, for example, chemical vapor deposition. The first metal layer 220 may be formed of a metal with superior trench filling ability (such as tungsten), so that voids will not be formed during filling the first metal layer 220 into the contact hole 213, thereby not deteriorating the electrical property of the device.

Next, still with reference to FIG. 2B, a part of the first metal layer 220 and a part of the barrier layer 219 on the dielectric layer 210 and in the opening 215 are removed by, for example, etching back, or chemical mechanical polishing (CMP) and then etching back. After that, the first metal layer 220 remained in the contact hole 213 is the contact window. The contact window is, for example, electrically connected to the heavily doped region 203 or the gate (not shown) of the heavily doped region 203. The first metal layer 220 remained on the side wall of the opening 215 acts as spacers. It should be noted that a part of the barrier layer 219 in the opening 215 can be removed through etching or can be remained depending on the requirements of the device.

Then, with reference to FIG. 2C, a buffer layer 223 is formed on the dielectric layer 210. The material of the buffer layer 223 can be, for example, titanium, titanium nitride, tantalum, tantalum nitride, tungsten nitride, titanium tungsten nitride, nickel, zinc, zinc nitride, chromium, chromium nitride, or the like, and can be formed by, for example, chemical vapor deposition. The buffer layer 223 can be arranged to cover the first metal layer 220, thereby avoiding cross contamination between the first metal layer 220 and the subsequently filled metal, i.e. the second metal layer 230. The buffer layer 223 can be selectively arranged depending on the requirements of the device.

Subsequently, a second metal layer 230 is formed on the buffer layer 223, and the material of the second metal layer 230 can be, for example, aluminum, copper, molybdenum, gold, platinum, alloys thereof, or the aluminum-silicon alloy by physical vapor deposition or chemical vapor deposition. Since the first metal layer 220 is disposed on both side walls of the opening 215 as the spacer, the opening 215 can be easily filled by the second metal layer 230.

With reference to FIG. 2C, the second metal layer 230 is patterned to separate the second metal layer 230 above the heavily doped region 203 from the second metal layer 230 above the lightly doped region 205. The method of patterning the second metal layer 230 comprises the steps of forming a patterned photoresist layer (not shown) on the second metal layer 230 and removing a part of the second metal layer 230 using the patterned photoresist layer as a mask. The second metal layer 230 above the heavily doped region 203 is used as a wire, while the second metal layer 230 above the lightly doped region 205 and the underlying substrate 200 form a Schottky diode.

In said manufacturing method of an integrated circuit structure, the fabrication process of the Schottky diode can be integrated with that of the contact window, so that the Schottky diode is formed on the same chip with a common logic element. In this case, it is unnecessary to form the Schottky diode on another chip as in the conventional manufacturing method, thus saving the cost of design and assembly and greatly improving the integrity of the device.

Figure 3A:
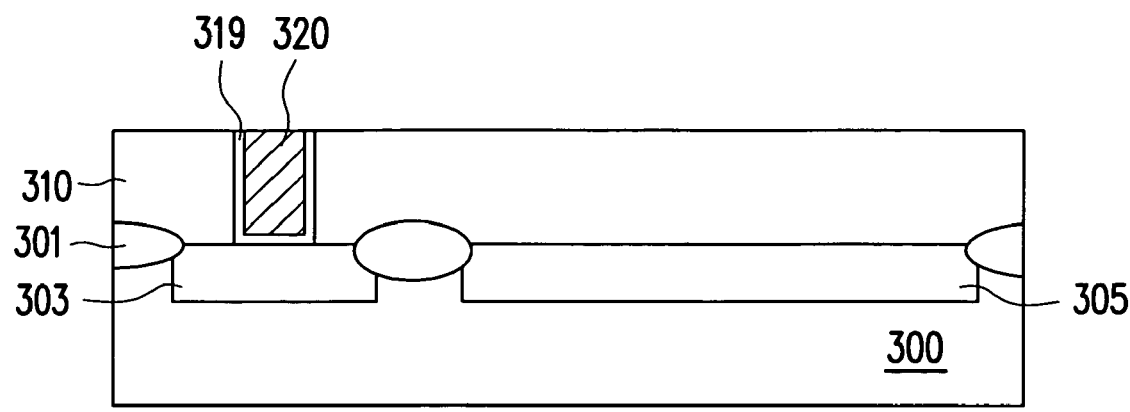
FIGS. 3A-3C are cross-sectional views of the manufacturing process of the integrated circuit structure according to another embodiment of the invention.
Figure 3B:
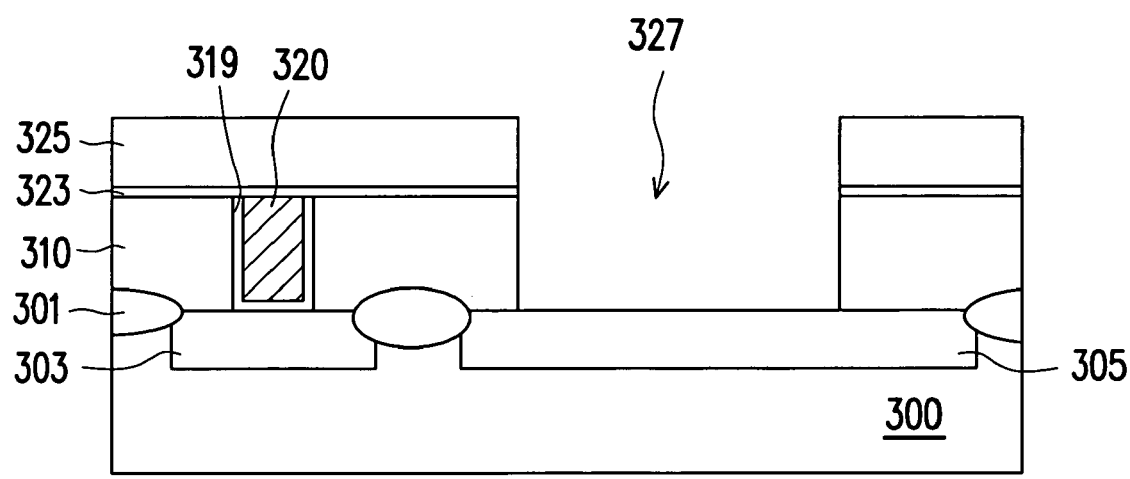
Figure 3C:
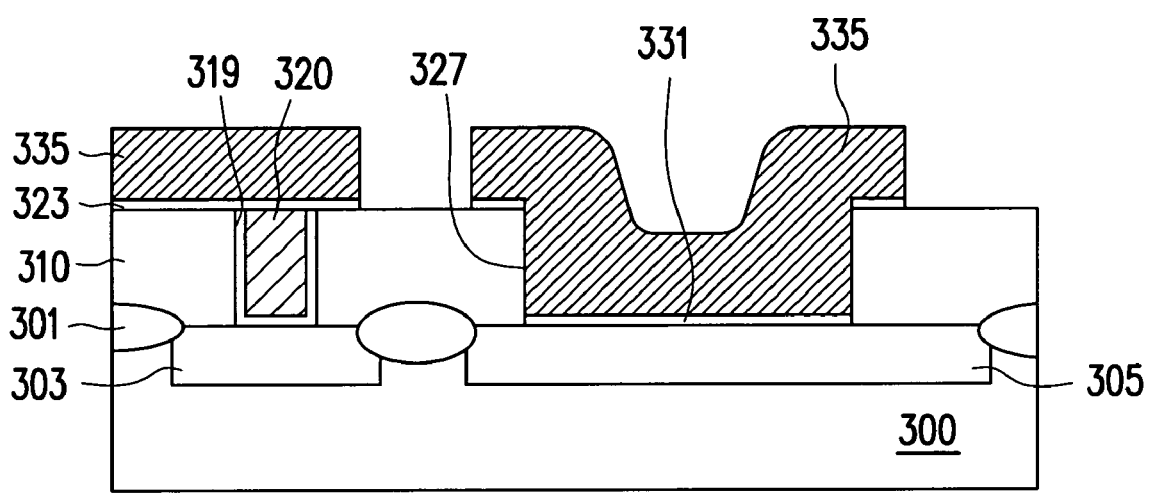

Another manufacturing method of an integrated circuit structure according to the invention will be illustrated below. FIGS. 3A-3C are cross-sectional views of the manufacturing process of the integrated circuit structure according to another embodiment of the invention.

With reference to FIG. 3A, according to the manufacturing method, for example, a substrate 300 with a heavily doped region 303 and a lightly doped region 305 formed therein is provided, wherein, these two doped regions are separated from each other by, for example, an isolation structure 301. The heavily doped region 303 is a doped region doped with, for example, P-type dopant or N-type dopant and the heavily doped region 303 may be disposed in a well region (not shown). The heavily doped region 303 is, for example, a source/drain of a common logic element (such as MOS element or a memory device), and other elements (such as the gate dielectric layer, the gate, and so on) are, for example, disposed on the heavily doped region 303. The conductive type of the lightly doped region 305 varies depending on, for example, the conductive type of the substrate 300. In particular, the lightly doped region 305 is an N-type lightly doped region if the substrate 300 is a P-type substrate, and the lightly doped region 305 is a P-type lightly doped region if the substrate 300 is an N-type substrate.

Then, still with reference to FIG. 3A, a conformal dielectric layer 310 is formed on the substrate 300 for covering the heavily doped region 303 and the lightly doped region 305, and the material of the dielectric layer 310 can be, for example, silicon oxide a formed by chemical vapor deposition.

Subsequently, still with reference to FIG. 3A, a contact window 320 is formed in the dielectric layer 310 and electrically connected to the heavily doped region 303 or the gate (not shown) of the heavily doped region 303. The material of the contact window 320 can be, for example, tungsten, copper, molybdenum, gold, platinum, or an alloy thereof. The contact window 320 may be formed of a metal having superior trench filling ability (such as tungsten), for avoiding voids formed and improving the electrical property of the device. The method of forming the contact window 320 will not be described any further as it is known by those skilled in the art. A barrier layer 319, for example, is disposed between the contact window 320, the dielectric layer 310 and the heavily doped region 303, and the material of the barrier layer 319 can be, for example, titanium, titanium nitride, tantalum, tantalum nitride, tungsten nitride, titanium-tungsten nitride, nickel, zinc, zinc nitride, chromium, or chromium nitride, formed by, for example, chemical vapor deposition.

Then, with reference to FIG. 3B, a buffer layer 323 is formed on the dielectric layer 310, and the material of the buffer layer 323 can be, for example, titanium, titanium nitride, tantalum, tantalum nitride, tungsten nitride, titanium-tungsten nitride, nickel, zinc, zinc nitride, chromium, or chromium nitride, formed by chemical vapor deposition. The buffer layer 323 can be arranged to cover the contact window 320, so that cross contamination between the contact window 320 and the subsequently filled metal (the metal layer 325) can be avoided. It is certain that the buffer layer 323 can be selectively arranged depending on the requirements of the device.

Subsequently, still with reference to FIG. 3B, a patterned photoresist layer 325 is formed on the buffer layer 323 and a part of the dielectric layer 310 on the lightly doped region 305 is exposed. The patterned photoresist layer 325 is, for example, a positive photoresist layer formed by spin-coating and then by exposure and development. Then, the exposed dielectric layer 310 will be removed by using the patterned photoresist layer 325 as a mask to form an opening 327. The exposed part of the dielectric layer 310 is removed by, for example, dry etching or wet etching.

Then, with reference to FIG. 3C, a barrier layer 331 is formed on the bottom of the opening 327, and the material of the barrier layer 331 can be, for example, titanium, titanium nitride, tantalum, tantalum nitride, tungsten nitride, titanium-tungsten nitride, nickel, zinc, zinc nitride, chromium, or chromium nitride, formed by, for example, chemical vapor deposition. Subsequently, the patterned photoresist layer 325 will be removed by, for example, dry photoresist stripping or wet photoresist stripping.

And finally, still with reference to FIG. 3C, a metal layer 335 is formed over the substrate 300, and the material of the metal layer 335 is different from that of the contact window 320. The material of the metal layer 335 can be, for example, aluminum, copper, molybdenum, gold, platinum, an alloy thereof, or the aluminum-silicon alloy, formed by physical vapor deposition or chemical vapor deposition. Then, the metal layer 335 is patterned and the metal layer 335 above the heavily doped region 303 is separated from the metal layer 335 above the lightly doped region 305. The method of patterning the metal layer 335, for example, comprises the steps of: firstly forming a patterned photoresist layer (not shown) on the metal layer 335 and then removing a part of the metal layer 335 by using the patterned photoresist layer as a mask. The metal layer 335 above the heavily doped region 303 is used as a wire. The metal layer 335 above the lightly doped region 305 is used as the Schottky contact metal layer and forms a Schottky diode together with the barrier layer 331 and the substrate 300.

Said manufacturing method of the integrated circuit structure comprises firstly forming the contact window 320, then the opening 327, and subsequently forming the metal layer 335. Therefore, the subsequently formed Schottky contact metal layer in the opening 327 has a better junction between the metal layer 335 and the lightly doped region 305. It is because the later formed buffer layer 331 or metal layer 335 is excused from possible damages during the formation of the contact window 320. Therefore, a Schottky diode of better quality can be achieved.

As described above, according to the integrated circuit structure and the manufacturing methods thereof provided by the invention, the process of the Schottky diode can be integrated with that of the contact window on the same chip. Therefore, the cost of design and assembly is reduced and the integrity of the device is improved. Furthermore, the contact window is formed of a metal having superior trench filling ability and the Schottky contact metal of the Schottky diode is formed of a low-resistance metal, thereby improving the electrical property of the device and obtaining an integrated circuit structure of better quality.

It will be apparent to those skilled in the art that various modifications and variations can be made to the structure of the present invention without departing from the scope or spirit of the invention. In view of this, it is intended that the present invention cover modifications and variations of this invention provided they fall within the scope of the following claims and their equivalents.

What is claimed is:

1. An integrated circuit structure, comprising:
a substrate of a first conductive type with a heavily doped region of a second conductive type and a lightly doped region of the second conductive type formed therein, wherein the first conductive type is different from the second conductive type, and the heavily doped region and the lightly doped region are separated from each other by an isolation structure;
a contact window disposed above the heavily doped region; and
a Schottky contact metal layer disposed above the lightly doped region, wherein the Schottky contact metal layer and the substrate under the Schottky contact metal layer form a Schottky diode, and a material of the contact window is different from a material of the Schottky contact metal layer.

2. The integrated circuit structure as claimed in claim 1, wherein the material of the Schottky contact metal includes aluminum, copper, molybdenum, gold, platinum, or alloy thereof.

3. The integrated circuit structure as claimed in claim 1, wherein the material of the contact window includes tungsten, copper, molybdenum, gold, platinum, or an alloy thereof.

4. The integrated circuit structure as claimed in claim 1, further comprising a spacer disposed on a side wall of the Schottky contact metal layer, wherein the spacer and the contact window are simultaneously formed of the same material.

5. The integrated circuit structure as claimed in claim 1, wherein a barrier layer is further disposed between the Schottky contact metal layer and the substrate.

6. The integrated circuit structure as claimed in claim 5, wherein a material of the barrier layer includes titanium, titanium nitride, tantalum, or tantalum nitride.

7. The integrated circuit structure as claimed in claim 1, wherein the contact window disposed over the substrate.

8. The integrated circuit structure as claimed in claim 1, wherein the contact window electrically connects to the heavily doped region.

9. The integrated circuit structure as claimed in claim 1, wherein Schottky contact metal layer electrically connects to the lightly doped region.

10. The integrated circuit structure as claimed in claim 1, wherein Schottky contact is located over the substrate.

11. The integrated circuit structure as claimed in claim 1, further comprises:
   a dielectric layer on the substrate, wherein the dielectric layer having an opening exposing the lightly doped region and a contact hole exposing the heavily doped region;
   the contact window disposed in the contact hole to electrically connect to the heavily doped region; and
   the Schottky contact metal layer disposed in the opening to electrically connect the lightly doped region.

* * * * *